United States Patent [19]

Hong

[11] Patent Number: 5,758,272
[45] Date of Patent: May 26, 1998

[54] AUTOMATIC GAIN CONTROLLING MECHANISM OF RADIO FREQUENCY AMPLIFIER

[75] Inventor: Jong-myeon Hong, Kwangmyung, Rep. of Korea

[73] Assignee: Kia Motors Corporation, Seoul, Rep. of Korea

[21] Appl. No.: 682,237

[22] Filed: Jul. 17, 1996

[30] Foreign Application Priority Data

May 7, 1996 [KR] Rep. of Korea ............... 96-14818

[51] Int. Cl.$^6$ ........................................... H04B 1/06
[52] U.S. Cl. .......................... 455/234.2; 455/293
[58] Field of Search ................ 455/234.1, 234.2, 455/269, 280, 293, 297, 311, 341, 345

[56] References Cited

U.S. PATENT DOCUMENTS 5,428,830  6/1995  Zerod et al. ............... 455/293 X

FOREIGN PATENT DOCUMENTS 62029  3/1989  Japan ............... 455/234.2

Primary Examiner—Thomas Mullen

[57] ABSTRACT

An automatic gain controlling mechanism of radio frequency amplifier for a glass antenna in a car audio system includes a radio frequency amplifier, an FM front end part used as a tuner, an FM detector/multiplexer, a volume controller and a voltage amplifier. The radio frequency amplifier is gain-variable. A microprocessor is connected to a voltage level output terminal of the FM detector/multiplexer at the data input terminal for receiving a voltage level signal detected by the FM detector/multiplexer and determining an intensity of an electric field intensity. The microprocessor is also connected to a gain variable terminal of the RF amplifier at the output terminal for transmitting a gain controlling signal to the RF amplifier. Thus, the increase or decrease of the gain of the radio frequency amplifier is automatically controlled.

4 Claims, 3 Drawing Sheets

AUTOMATIC GAIN CONTROLLING MECHANISM OF RADIO FREQUENCY AMPLIFIER

FIELD OF THE INVENTION

This invention relates to an automatic gain controlling mechanism of a radio frequency amplifier to improve the receiving sensitivity of a glass antenna in car audio systems and, more particularly, to a gain controlling mechanism of a radio frequency amplifier for a glass antenna in a car audio system, wherein the gain of the radio frequency amplifier is automatically controlled according to the electric field intensity received to the antenna, thus improving the receiving sensitivity of radio frequencies.

DESCRIPTION OF THE PRIOR ART

Generally, automobiles are provided with car audio systems having antennas installed at the front or rear part thereof, through which broadcasting signals transmitted from a transmitting station are received.

Recently, most of the antennas installed in the automobiles are substituted with auto-antennas, so-called power-antennas wherein a motor to operate the power-antenna is driven by the supply of power and the antenna is automatically projected from the inside of the automobile to the outside and wherein the motor is power-off and the antenna is automatically returned inside the automobile.

As for the power-antenna, a pole antenna having three to five segments is adopted. All of the three or five segments are projected externally in case of use and inserted into a panel of the automobile in case of non-use for preventing the antenna from being damaged by the collision with external objects.

The antenna for the car audio system has, however, disadvantages that the wind and its noise interfere with the transmitted radio signals and the sensitivity of the antenna is degraded, since the antenna is projected vertically outside the car and sways in the wind especially while driving.

In order to resolve these problems, glass antennas were introduced to be installed in the glass of the automobile. FIG. 1 shows a conventional car audio system as an example.

In FIG. 1, a glass antenna 12 is attached to or deposited on a wind glass 10 and receives radio signals from transmission station. The radio signals are amplified through a radio frequency (RF) amplifier 14. The RF amplifier 14 has a fixed gain and amplifies the frequency of the radio signal to a predetermined level, thus the amplified signal being input to an audio set 16. The audio set 16 comprises an FM front end part (tuner) for selecting a desired channel from the output signals from the RF amplifier 14, an FM detector/multiplexer for detecting FM radio signals, a volume controller for controlling the volume of the sound of the detected FM radio signals, a voltage amplifier for amplifying fine sound volume signals to a predetermined level and a speaker. A cassette tape deck and/or a compact disc player may be further installed.

Even though the conventional car audio system as above can improve the receiving sensitivity of the radio signals through all electric fields, it has still problems that the RF amplifier 14 amplifies the radio signals received via the glass antenna 12 as much as its fixed gain, and accordingly noise level increases and interference with the radio signals from adjacent broadcasting stations may be caused.

SUMMARY OF THE INVENTION

It is, therefore, an object of the present invention to provide an automatic gain controlling mechanism of a radio frequency amplifier for glass antennas in car audio systems, wherein the gain of the radio frequency amplifier is automatically controlled according to the electric field intensity received by the antenna and detected by a detector so as to improve the receiving sensitivity of the radio signals.

According to the present invention, the gain controlling mechanism of a radio frequency amplifier for a glass antenna in the car audio system is provided, and the car audio system comprises the glass antenna, a radio frequency (RF) amplifier, an FM front end as a tuner, an FM detector/multiplexer, a volume controller and a voltage amplifier which are connected in sequence, wherein the radio frequency amplifier is gain-variable and a microprocessor is further provided and connected to a voltage level output terminal of the FM detector/multiplexer at its data input terminal so as to automatically increase or decrease of the gain the radio frequency amplifier.

According to the present invention, when the radio signal received via the glass antenna is transmitted to the car audio system, the receiving sensitivity in the weak electric field intensity area is improved and the noise level in the strong electric field intensity area is reduced by automatically controlling the gain of the radio frequency amplifier according to the electric field intensity.

BRIEF DESCRIPTION OF THE DRAWINGS

A better understanding of the present invention may be obtained from a consideration of the detailed description hereinafter taken in conjunction with the drawings which are briefly described below, in which.

DETAILED DESCRIPTION OF THE PREFERRED EMBODIMENT

The present invention is now described in more detail with reference to the accompanying drawings.

Figure 1:
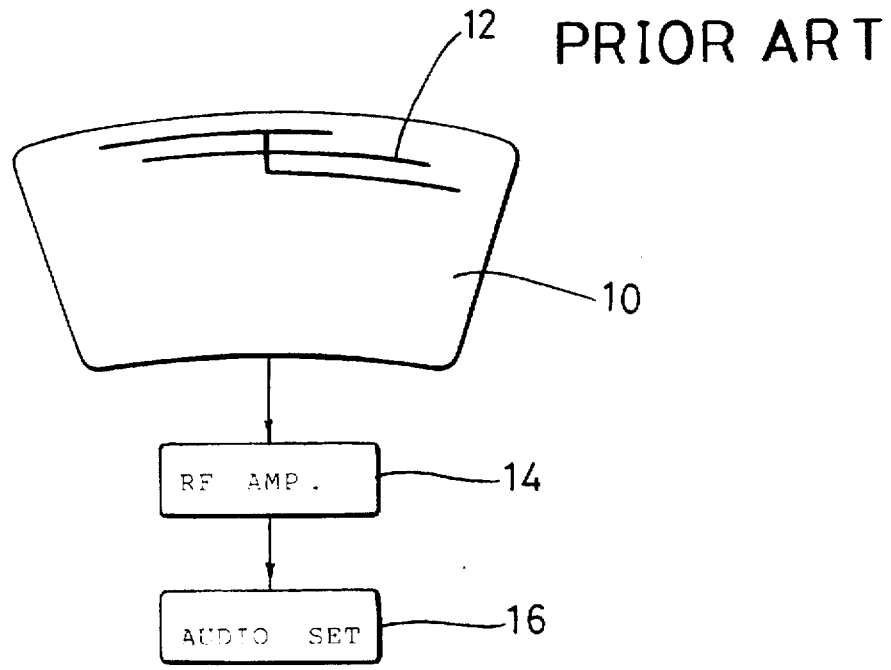
FIG. 1 is a schematic diagram showing the construction of a conventional car audio system.
Figure 2:
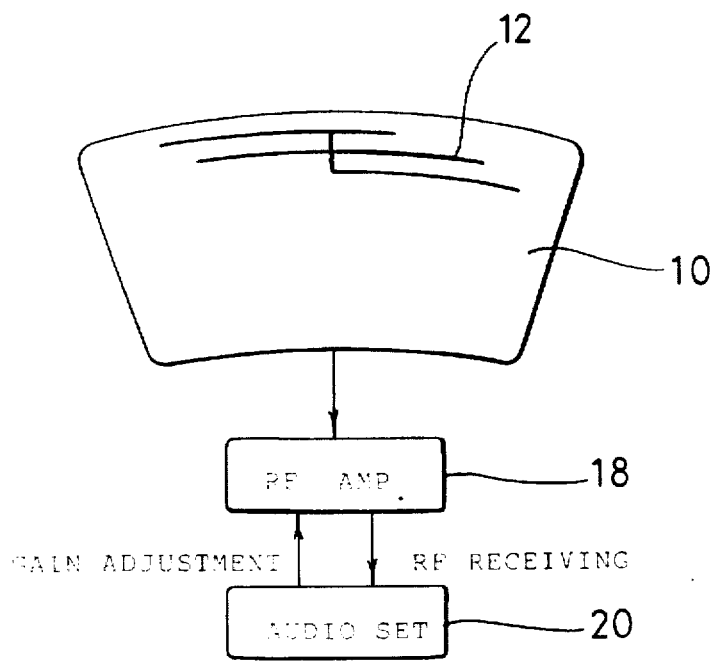
FIG. 2 is a schematic diagram showing the construction of a car audio system according to the present invention.

FIG. 2 shows a car audio system according to the present invention, wherein the car audio system comprises a glass antenna 12, a radio frequency (RF) amplifier 18, and an audio set 20, and the RF amplifier 18 has a gain which is not fixed but automatically variable.

Figure 3:
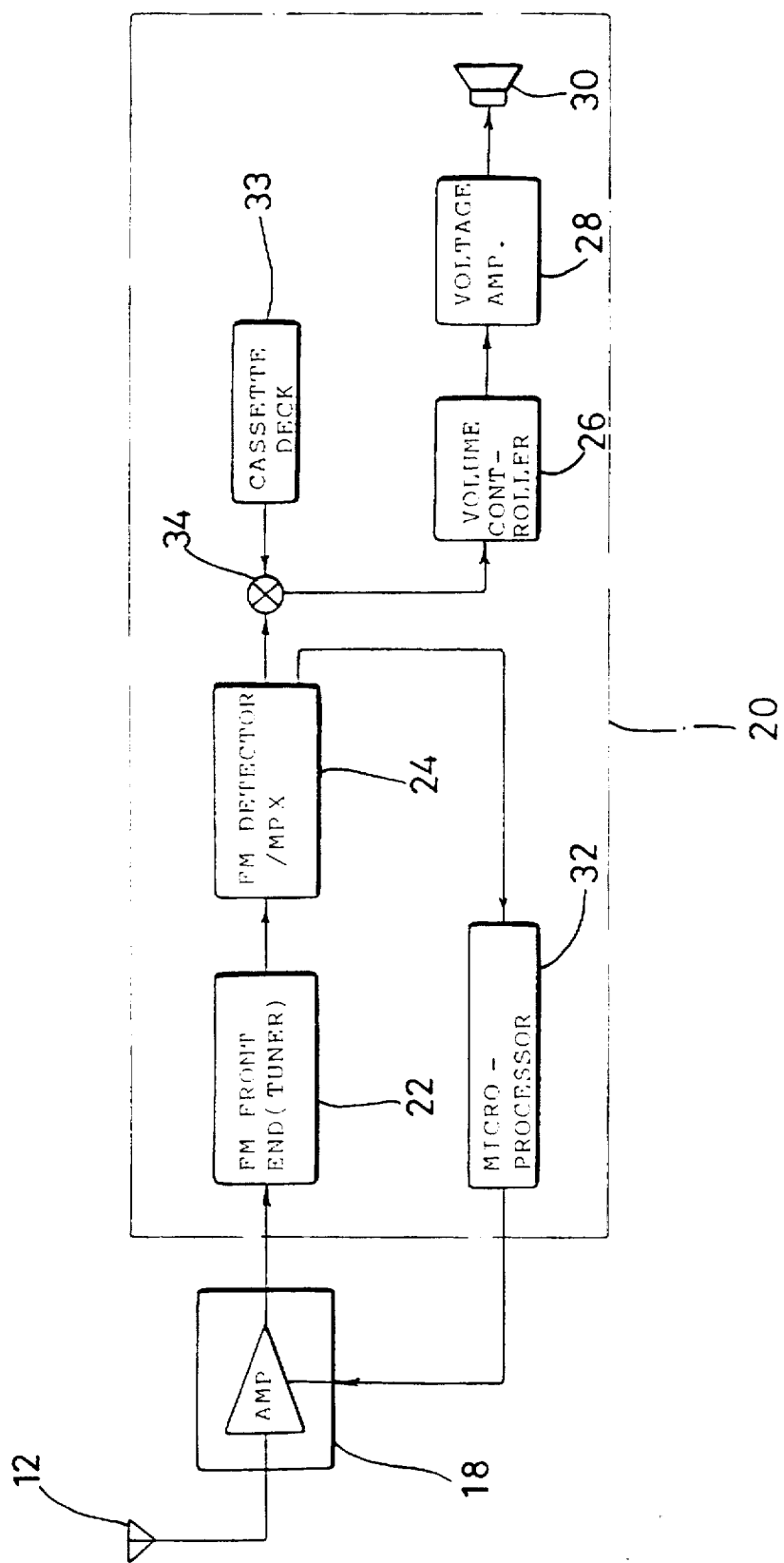
FIG. 3 is a block diagram of the car audio system of FIG. 2.

Referring to FIG. 3, the car audio system is more detailed to explain the automatic control of the variable gain of the RF amplifier according to the voltage level of an input radio signal. In FIG. 3, the RF amplifier 18 has an output terminal connected to an FM front end part (tuner) 22. The FM front end part 22 has an output terminal connected to an FM detector/multiplexer 24. The FM detector/multiplexer 24 has an output terminal connected to a switch 34 and finally connected with a speaker 30 via a volumn controller 26 and a voltage amplifier 28 in sequence. Further, a microprocessor 32 is provided and it has a data input terminal which is connected to a voltage level output terminal of the FM detector/multiplexer 24 and an output terminal which is connected to a gain-variable terminal of the RF amplifier 18.

Unexplained numeral 33 is a cassette deck and the switch 34 is provided to switch the outputs from the radio signals received via the glass antenna and those from the cassette deck 33.

Figure 4:
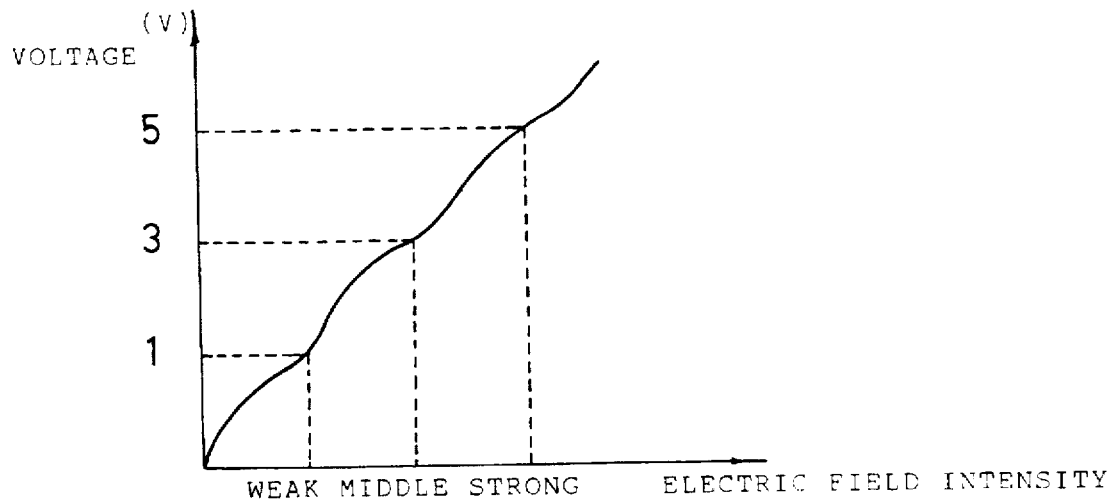
FIG. 4 is a view showing voltage level corresponding to the electric field intensity according to the present invention.

The FM detector/multiplexer 24 detects an electric field intensity of the input radio signal and outputs a corresponding voltage level signal to the microprocessor 32 via its voltage level output terminal, wherein the voltage level depends upon the electric field intensity as shown in FIG. 4.

Referring to FIG. 4, the output of the voltage level is about 1V in a weak electric field, 3V in a middle electric field and 5V in a strong electric field. FIG. 4 shows an example for the sake of convenience of description and these voltage levels may be variable according to the audio sets.

The microprocessor 32 transmits a predetermined control signal to the RF amplifier 18 for controlling the gain of the RF amplifier 18 according to the voltage level output from the voltage level output terminal of the FM detector/multiplexer 24. 3V of the middle electric field area may be a reference voltage and it is compared with the input voltages. If the voltage input is more than 3V in an area, the microprocessor 32 regards the area as a strong electric field intensity area and transmits a control signal for reducing the gain to the RF amplifier 18. To the contrary, if the voltage input is less than 3V in an area, the microprocessor 32 regards the area as a weak electric field intensity area and outputs a control signal for increasing the gain to the RF amplifier 18.

Therefore, it becomes possible to reduce the noise by reducing the gain of the RF amplifier 18 when the received electric field intensity is strong, and to improve the receiving sensitivity by increasing the gain when the received electric field intensity is weak.

Figure 5:
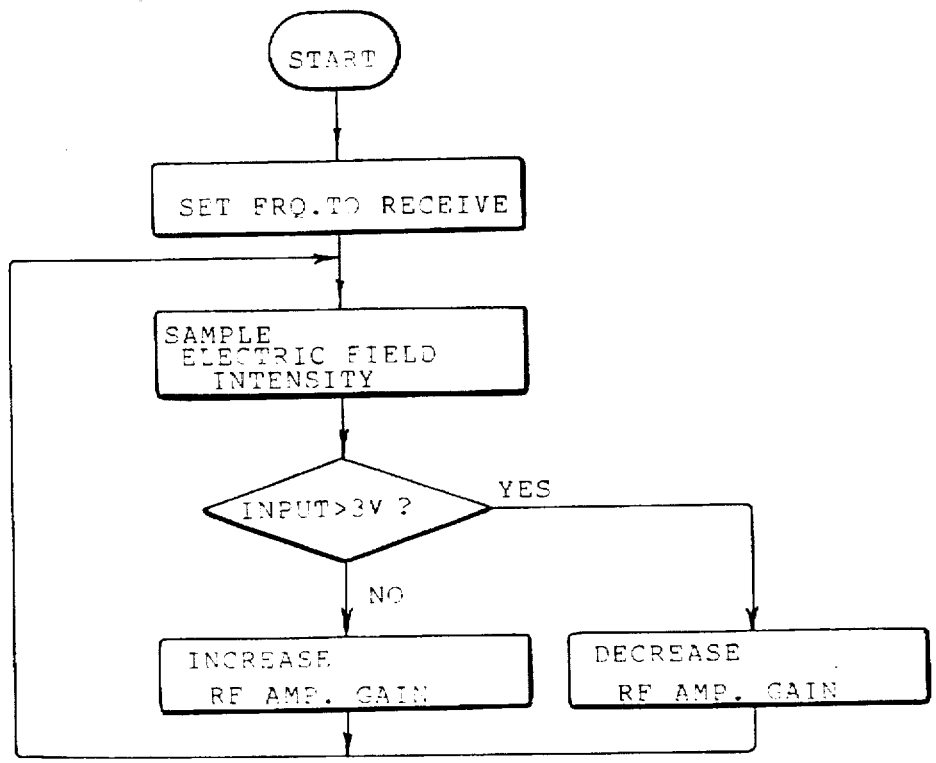
FIG. 5 is a flow chart for explaining the operation of an automatic gain control according to the present invention.

FIG. 5. is a flow chart for explaining the control operation of the microprocessor 32.

If a user tunes an audio set to a desired channel, corresponding radio frequency signal received via the glass antenna 12 is amplified to a predetermined level by the RF amplifier 18 and then the amplified signal is input to the FM front end part 22. The FM front end part 22 tunes only the radio frequency signal selected by the user and transmits the signal to the FM detector/multiplexer 24.

The FM detector/multiplexer 24 detects the electric field intensity of the received RF signal and outputs a corresponding voltage level signal to the microprocessor 32 at its voltage level output terminal. The microprocessor 32 decides whether the voltage level output from the FM detector/multiplexer 24 is in the range of the middle electric field intensity, so that the microprocessor 32 outputs a control signal to reduce the gain of the amplifier 18 in case of higher voltage level than 3V and outputs a control signal to increase the gain in case of lower level less than 3V.

According to the present invention, the gain of the RF amplifier is variable and automatically controlled by the microprocessor according to the electric field intensity of the radio signal received via the glass antenna, so that the receiving sensitivity can be improved by increasing the gain of the amplifier in the weak electric field intensity area while the noise level can be lowered by reducing the gain of the amplifier in the strong electric field intensity area.

Those skilled in the art will appreciate that the foregoing description of preferred embodiments of the present invention is illustrative only, and that various changes and modifications in the invention as defined by the appended claims may be made without departing from the spirit and scope of the invention.

What is claimed is:

1. An automatic gain controlling mechanism of radio frequency amplifier for a glass antenna in a car audio system which comprises the glass antenna, a radio frequency amplifier, an FM front end part used as a tuner, an FM detector/multiplexer, a volume controller and a voltage amplifier in sequence, characterized in that the radio frequency amplifier is gain-variable and a microprocessor is further provided having a data input terminal and an output terminal and connected to a voltage level output terminal of the FM detector/multiplexer at the data input terminal for receiving a voltage level signal detected by the FM detector/multiplexer and determining an intensity of an electric field intensity, and the microprocessor is also connected to a gain variable terminal of the RF amplifier at the output terminal for transmitting a gain controlling signal to the RF amplifier, thus the increase or decrease of the gain of the radio frequency amplifier being automatically controlled.

2. An automatic gain controlling mechanism of the radio frequency amplifier for a glass antenna according to claim 1, wherein the microprocessor decides whether the voltage level signal from the FM detector/multiplexer is in a range of a middle electric field intensity so as to decrease the gain of the radio frequency amplifier in a strong electric field intensity area and to increase the gain in a weak electric field intensity area.

3. An automatic gain controlling mechanism of the radio frequency amplifier for a glass antenna according to claim 1, wherein the microprocessor is used to control the increase or decrease of the gain of the radio frequency amplifier instead of an automatic gain control circuit.

4. In an automatic gain controlling mechanism of radio frequency amplifier for a glass antenna in a car audio system which comprises the glass antenna, a radio frequency amplifier, an FM front end part used as a tuner, an FM detector/multiplexer, a volume controller and a voltage amplifier in sequence, a control system comprising a microprocessor having a data input terminal and an output terminal and connected to a voltage level output terminal of the FM detector/multiplexer at the data input terminal for receiving a voltage level signal detected by the FM detector/multiplexer and determining an intensity of an electric field intensity, and the microprocessor is also connected to a gain variable terminal of the RF amplifier at the output terminal for transmitting a gain controlling signal to the RF amplifier, thus the increase or decrease of the gain of the radio frequency amplifier being automatically controlled, wherein the microprocessor is used to control the increase or decrease of the gain of the radio frequency amplifier instead of an automatic gain control circuit.

\* \* \* \* \*